(12) United States Patent
Ju

(10) Patent No.: US 7,147,483 B1
(45) Date of Patent: Dec. 12, 2006

(54) ELECTRICAL CONNECTOR ASSEMBLY

(75) Inventor: Ted Ju, Keelung (TW)

(73) Assignee: Lotes Co., Ltd., Keelung (TW)

( * ) Notice: Subject to any disclaimer, the term of this patent is extended or adjusted under 35 U.S.C. 154(b) by 0 days.

(21) Appl. No.: 11/350,813

(22) Filed: Feb. 10, 2006

(30) Foreign Application Priority Data

Aug. 24, 2005 (CN) .......................... 2005 2 0063329
Dec. 2, 2005 (TW) ............................... 94220988 U

(51) Int. Cl.
*H01R 12/00* (2006.01)
(52) U.S. Cl. .......................................... 439/73; 439/331
(58) Field of Classification Search .................. 439/73, 439/260, 261, 342, 330, 331
See application file for complete search history.

(56) References Cited

U.S. PATENT DOCUMENTS

| | | | | |
|---|---|---|---|---|
| 3,942,854 A | * | 3/1976 | Klein et al. ................. | 439/331 |
| 4,502,747 A | * | 3/1985 | Bright et al. ................ | 439/296 |
| 5,167,515 A | * | 12/1992 | Matsuoka et al. ........... | 439/108 |
| 6,957,973 B1 | * | 10/2005 | McHugh et al. ............ | 439/331 |
| 6,974,345 B1 | * | 12/2005 | Yang et al. .................. | 439/331 |
| 6,991,474 B1 | * | 1/2006 | Ju ................................ | 439/73 |

* cited by examiner

*Primary Examiner*—Khiem Nguyen
(74) *Attorney, Agent, or Firm*—Jeffrey A. Lindeman; Nixon Peabody, LLP

(57) ABSTRACT

An electrical connector assembly includes a connector mounted in an insulating housing and connected electrically to an electronic device received in the insulating housing. An anchoring device includes a mounting frame fixed to a circuit board and formed with an opening for receiving the insulating housing, and U-shaped first and second pressing rods mounted pivotally and respectively on opposite first and second sides of the mounting frame. Each of the first and second pressing rods has an intermediate rod portion having a bent central section to abut against the electronic device. Lateral rod portions of the second pressing rod press respectively against two extensions of the first pressing rod, and are anchored releasably to the first side of the mounting frame.

6 Claims, 5 Drawing Sheets

ELECTRICAL CONNECTOR ASSEMBLY

CROSS-REFERENCE TO RELATED APPLICATION

This application claims priority of Chinese Application No. 200520063329.9, filed on Aug. 24, 2005.

BACKGROUND OF THE INVENTION

1. Field of the Invention

The invention relates to an electrical connector assembly, more particularly to an electrical connector assembly having an anchoring device.

2. Description of the Related Art

A conventional electrical connector assembly is used for interconnecting electrically a semiconductor device, such as a land grid array package, and a circuit board. The conventional electrical connector assembly includes a base frame fixed on the circuit board and having a central opening, a connector having an insulating seat mounted in the central opening in the base frame and mounted with a plurality of conductive terminals, and an upper frame mounted pivotally on a first side of the base frame and disposed over the semiconductor device. An L-shaped anchoring member has an abutting portion mounted pivotally on a second side of the base frame, which is opposite to the first side, and abutting against the upper frame, and an operating portion connected to the abutting portion and operable to be anchored releasably to the upper frame such that the semiconductor device can be positioned between the upper frame and the insulating seat, thereby ensuring electrical connection between the semiconductor device and the circuit board via the conductive terminals.

However, the upper and base frames are made of metal and have relatively complicated structures, thereby resulting in relatively high costs.

SUMMARY OF THE INVENTION

Therefore, the object of the present invention is to provide an electrical connector assembly that can eliminate the aforesaid drawbacks of the prior art.

According to the present invention, there is provided an electrical connector assembly adapted for interconnecting electrically an electronic device and a circuit board. The electronic device has a plurality of conductive contacts. The electrical connector assembly comprises:

a connector including an insulating housing confining a receiving space adapted to receive the electronic device, and a plurality of conductive terminals mounted in the insulating housing and adapted to contact electrically the conductive contacts of the electronic device when the electronic device is disposed in the receiving space in the insulating housing; and an anchoring device including a mounting frame adapted to be fixed to the circuit board and formed with a central opening for receiving the insulating housing such that the conductive terminals of the connector are adapted to contact electrically the circuit board, the mounting frame having first and second sides opposite to each other in a direction, a U-shaped first pressing rod having opposite lateral rod portions, each of which extends along the direction and has opposite coupling and free ends, and an intermediate rod portion interconnecting the coupling ends of the lateral rod portions of the first pressing rod and mounted pivotally on the first side of the mounting frame, the intermediate rod portion of the first pressing rod having a bent central section that is adapted to abut against the electronic device when the electronic device is disposed in the receiving space in the insulating housing, each of the lateral rod portions of the first pressing rod having an extension extending laterally from the free end thereof, and a U-shaped second pressing rod having opposite lateral rod portions, each of which has opposite coupling and operating ends, is longer than the lateral rod portions of the first pressing rod, and presses against the extension of a corresponding one of the lateral rod portions of the first pressing rod, and an intermediate rod portion interconnecting the coupling ends of the lateral rod portions of the second pressing rod and mounted pivotally on the second side of the mounting frame, the intermediate rod portion of the second pressing rod having a bent central section that is adapted to abut against the electronic device when the electronic device is disposed in the receiving space in the insulating housing, the operating ends of the lateral rod portions of the second pressing rod being operable to be anchored releasably to the first side of the mounting frame such that the electronic device is anchored to the insulating housing of the connector and such that the conductive contacts of the electronic device are connected electrically to the circuit board via the conductive terminals of the connector.

BRIEF DESCRIPTION OF THE DRAWINGS

Other features and advantages of the present invention will become apparent in the following detailed description of the preferred embodiment with reference to the accompanying drawings, of which.

DETAILED DESCRIPTION OF THE PREFERRED EMBODIMENT

Figure 1:
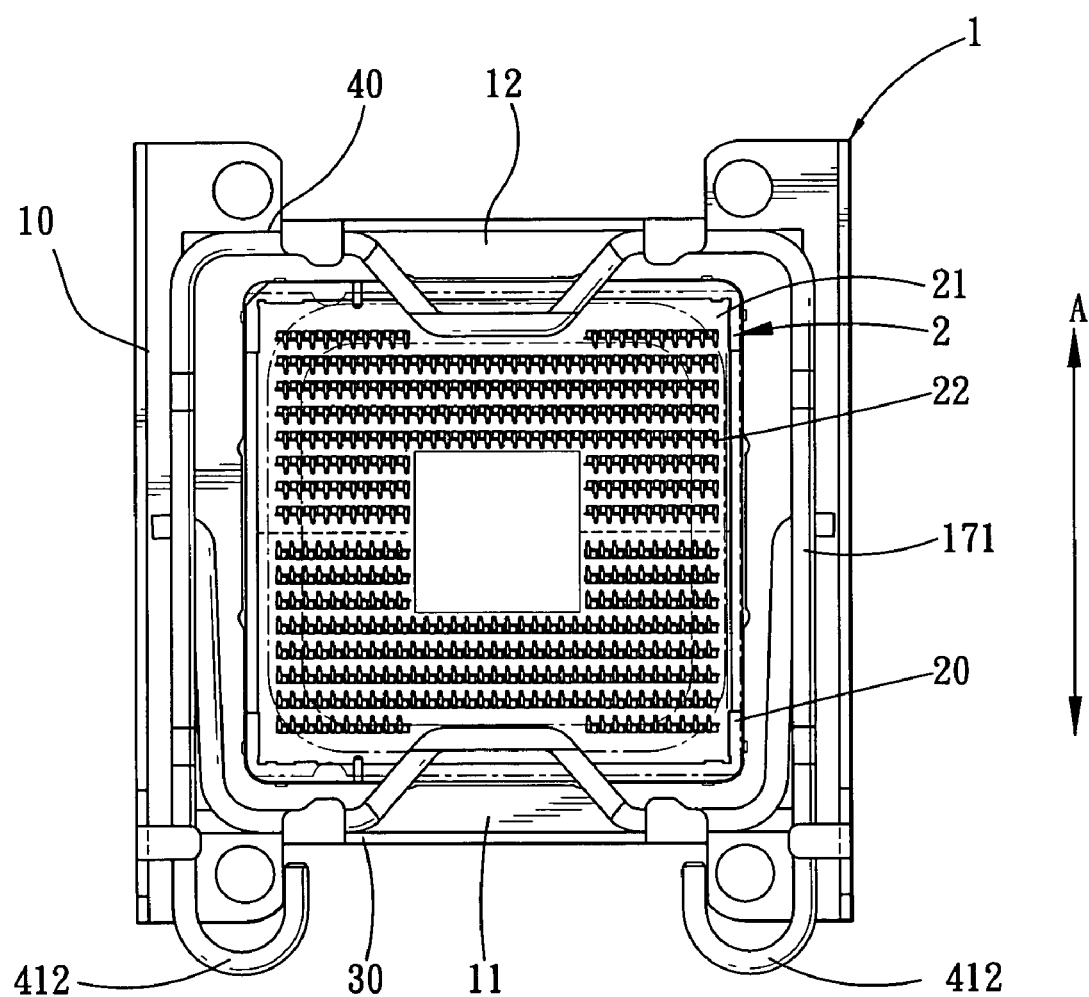
FIG. 1 is a schematic top view showing the preferred embodiment of an electrical connector assembly according to the present invention.

Referring to FIG. 1, the preferred embodiment of an electrical connector assembly according to the present invention is shown to include a connector 2 and an anchoring device 1. In this embodiment, the electrical connector assembly is adapted for interconnecting electrically an electronic device (not shown) and a circuit board (not shown). In this embodiment, the electronic device includes a semiconductor device, such as a land grid array package, that has a plurality of conductive contacts arranged in a known manner.

Figure 2:
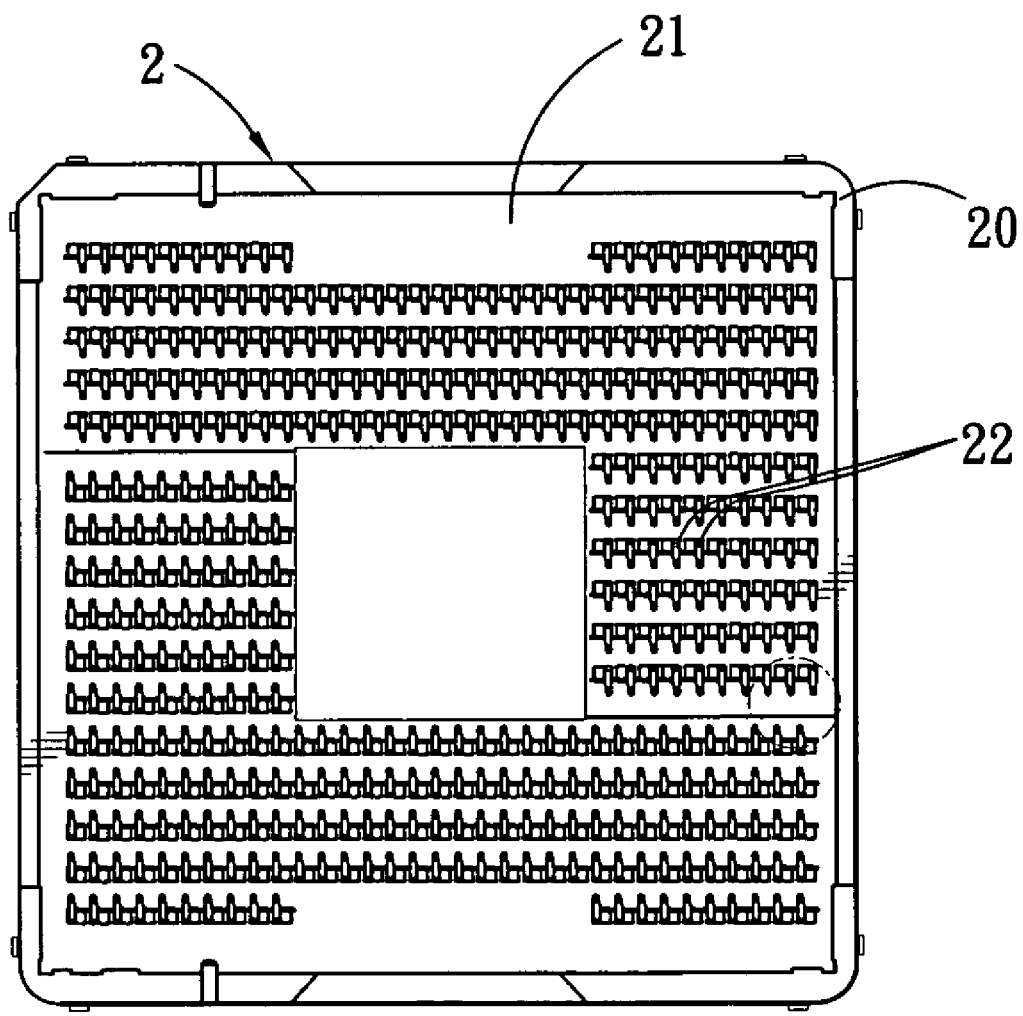
FIG. 2 is a schematic top view of a connector of the preferred embodiment.

Referring further to FIG. 2, the connector 2 includes an insulating housing 20 confining a receiving space 21 adapted to receive the electronic device, and a plurality of conductive terminals 22 mounted in the insulating housing 20 and adapted to contact electrically the conductive contacts of the electronic device when the electronic device is disposed in the receiving space 21 in the insulating housing 20.

Referring further to FIGS. 3 to 6, the anchoring device 1 is shown to include a mounting frame 10, a U-shaped first pressing rod 30, and a U-shaped second pressing rod 40.

The mounting frame 10 is adapted to be fixed to the circuit board, and is formed with a central opening 100 for receiving the insulating housing 20, as shown in FIG. 1, such that the conductive terminals 22 of the connector 2 are adapted to contact electrically the circuit board (not shown). The mounting frame 10 has first and second sides 11, 12 opposite to each other in a direction (A). In this embodiment, the mounting frame 10 has C-shaped first and second pivot lug units 111, 121 disposed respectively on the first and second sides 11, 12 (see FIG. 4). Each of the first and second pivot lug units 111, 121 includes a pair of pivot lugs spaced apart from each other. The mounting frame 10 further has a pair of C-shaped engaging hooks 103 disposed on the first side 11 and spaced apart from each other in a second direction (B) that is perpendicular to the first direction (A) (see FIG. 5).

Figure 3:
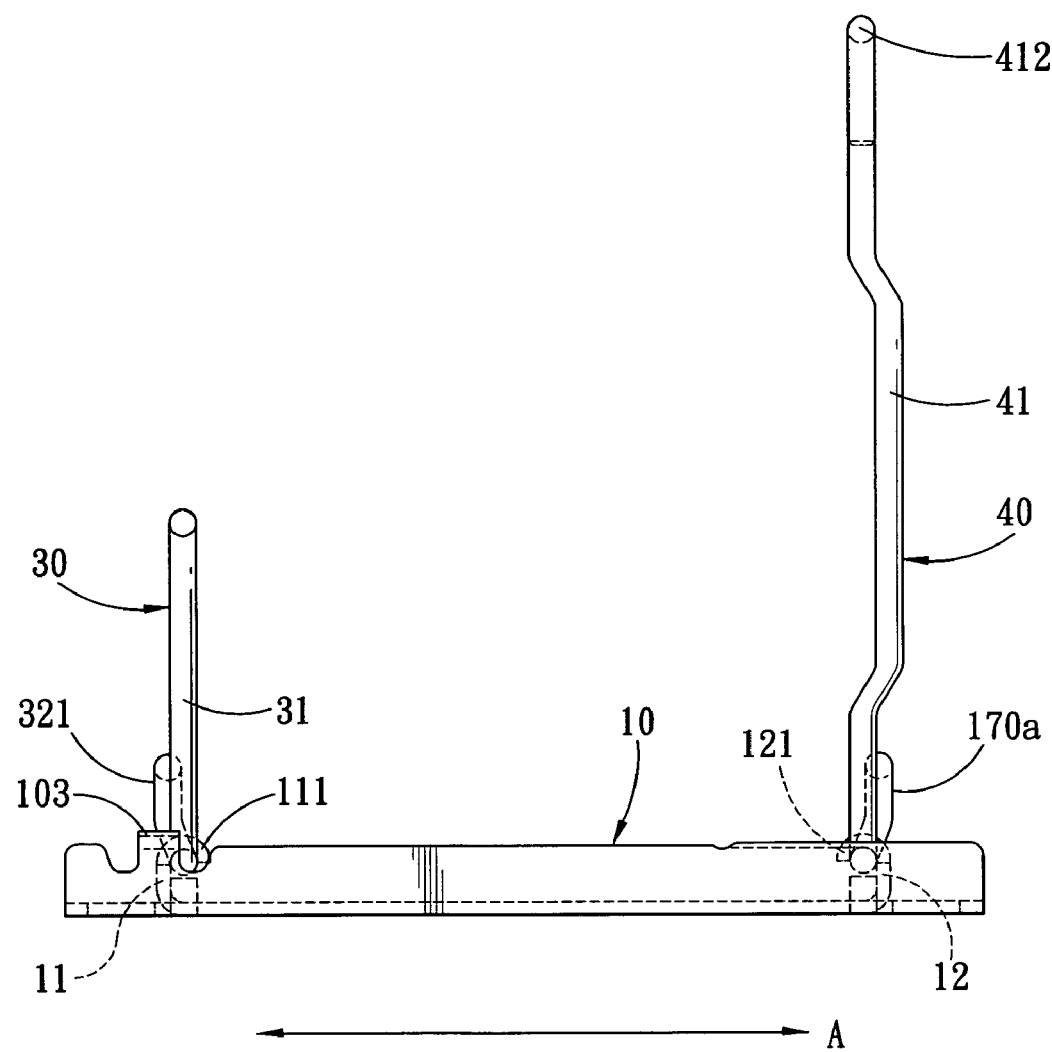
FIG. 3 is a schematic front view of an anchoring device of the preferred embodiment, illustrating how first and second pressing rods are pivoted to upright positions.
Figure 4:
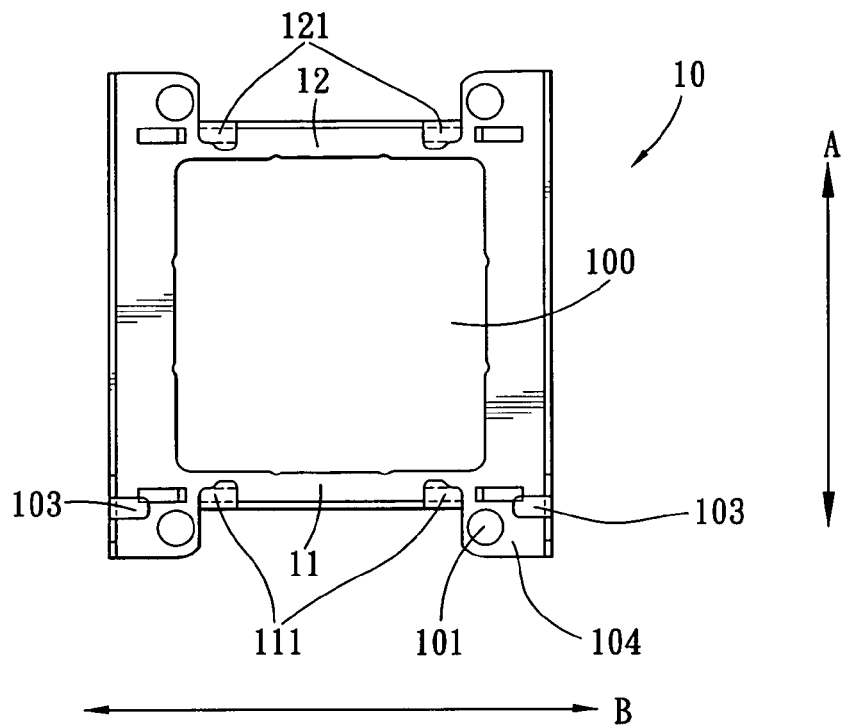
FIG. 4 is a schematic top view of a mounting frame of the anchoring device of the preferred embodiment.
Figure 5:
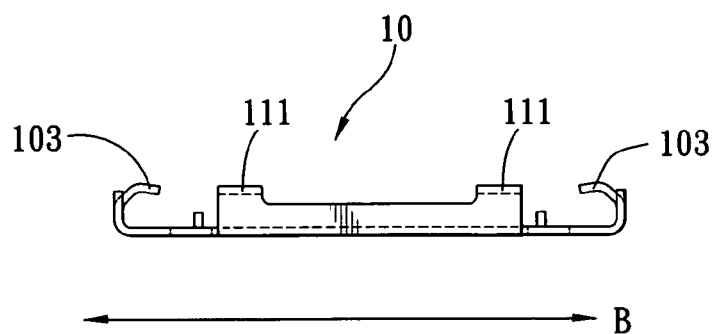
FIG. 5 is a schematic front view of the mounting frame of the preferred embodiment.
Figure 6:
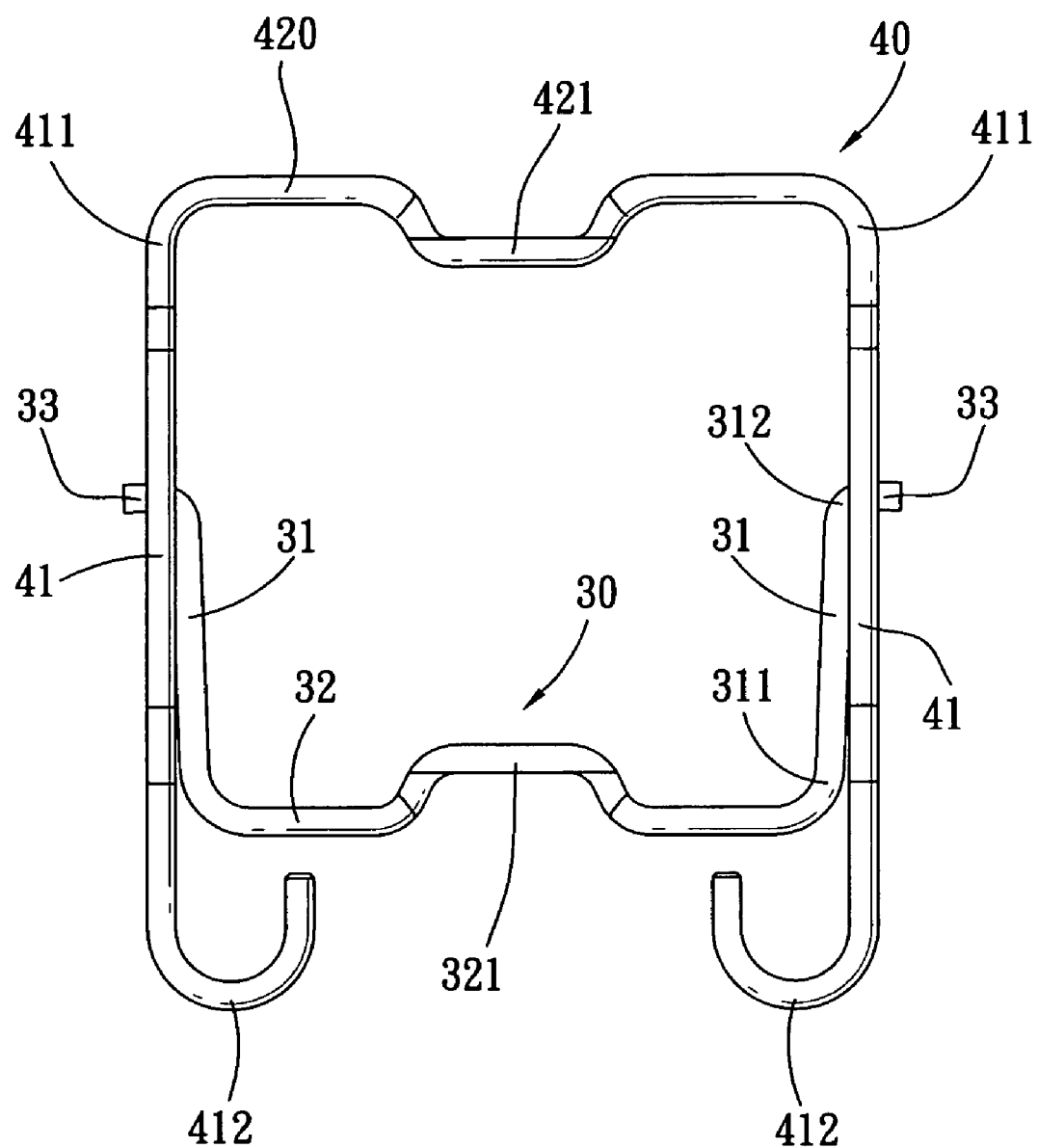
FIG. 6 is a schematic view of the first and second pressing rods of the preferred embodiment.

The first pressing rod 30 has opposite lateral rod portions 31, each of which extends along the first direction (A) and has opposite coupling and free ends 311, 312, and an intermediate rod portion 32 interconnecting the coupling ends 311 of the lateral rod portions 31 of the first pressing rod 30 and mounted pivotally on the first side 11 of the mounting frame 10 by the first pivot lug unit 111, as shown in FIGS. 1 and 3. The intermediate rod portion 32 of the first pressing rod 30 has a bent central section 321 that is adapted to abut against the electronic device when the electronic device is disposed in the receiving space 21 in the insulating housing 20 of the connector 2. Each of the lateral rod portions 31 of the first pressing rod 30 has an extension 33 extending laterally from the free end 312 thereof, as shown in FIG. 6. In this embodiment, the bent central section 321 of the intermediate rod portion 32 of the first pressing rod 30 is configured as a U-shaped plate.

The second pressing rod 40 has opposite lateral rod portions 41, each of which has opposite coupling and operating ends 411, 412, is longer than the lateral rod portions 31 of the first pressing rod 30, and presses against the extension 33 of a corresponding one of the lateral rod portions 31 of the first pressing rod 30, and an intermediate rod portion 42 interconnecting the coupling ends 411 of the lateral rod portions 41 of the second pressing rod 40 and mounted pivotally on the second side 12 of the mounting frame 30 by the second pivot lug unit 121, as shown in FIGS. 1 and 3. In this embodiment, a distance between the lateral rod portions 31 of the first pressing rod 30 is substantially smaller than that between the lateral rod portions 41 of the second pressing rod 40, as shown in FIG. 6. The operating ends 412 are hook-shaped, and extend initially toward each other and then toward the intermediate rod portion 32 of the first pressing rod 30. The intermediate rod portion 42 of the second pressing rod 40 has a bent central section 421 that is adapted to abut against the electronic device when the electronic device is disposed in the receiving space 21 in the insulating housing 20 of the connector 2. The operating ends 412 of the lateral rod portions 41 of the second pressing rod 40 are operable to be anchored releasably and respectively to the first side 11 of the mounting frame 10 by the engaging hooks 103 (see FIG. 1) such that the electronic device is anchored to the insulating housing 20 of the connector 2 and such that the conductive contacts of the electronic device are connected electrically to the circuit board via the conductive terminals 22 of the connector 2. In this embodiment, the bent central section 421 of the intermediate rod portion 42 of the second pressing rod 40 is configured as a U-shaped plate.

Since the anchoring device 1 has a relatively simple structure, the electrical connector assembly of the present invention can be easily operated and can be manufactured at lower costs.

While the present invention has been described in connection with what is considered the most practical and preferred embodiment, it is understood that this invention is not limited to the disclosed embodiment but is intended to cover various arrangements included within the spirit and scope of the broadest interpretation so as to encompass all such modifications and equivalent arrangements.

I claim:

1. An electrical connector assembly adapted for interconnecting electrically an electronic device and a circuit board, the electronic device having a plurality of conductive contacts, said electrical connector assembly comprising:

a connector including an insulating housing confining a receiving space adapted to receive the electronic device, and a plurality of conductive terminals mounted in said insulating housing and adapted to contact electrically the conductive contacts of the electronic device when the electronic device is disposed in said receiving space in said insulating housing; and an anchoring device including a mounting frame adapted to be fixed to the circuit board and formed with a central opening for receiving said insulating housing such that said conductive terminals of said connector are adapted to contact electrically the circuit board, said mounting frame having first and second sides opposite to each other in a direction, a U-shaped first pressing rod having opposite lateral rod portions, each of which extends along the direction and has opposite coupling and free ends, and an intermediate rod portion interconnecting said coupling ends of said lateral rod portions of said first pressing rod and mounted pivotally on said first side of said mounting frame, said intermediate rod portion of said first pressing rod having a bent central section that is adapted to abut against the electronic device when the electronic device is disposed in said receiving space in said insulating housing, each of said lateral rod portions of said first pressing rod having an extension extending laterally from said free end thereof, and a U-shaped second pressing rod having opposite lateral rod portions, each of which has opposite coupling and operating ends, is longer than said lateral rod portions of said first pressing rod, and presses against said extension of a corresponding one of said lateral rod portions of said first pressing rod, and an intermediate rod portion interconnecting said coupling ends of said lateral rod portions of said second pressing rod and mounted pivotally on said second side of said mounting frame, said intermediate rod portion of said second pressing rod having a bent central section that is adapted to abut against the electronic device when the electronic device is disposed in said receiving space in said insulating housing, said operating ends of said lateral rod portions of said second pressing rod being operable to be anchored releasably to said first side of said mounting frame such that the electronic device is anchored to said insulating housing of said connector and such that the conductive contacts of said electronic device are connected electrically and respectively to the circuit board via said conductive terminals of said connector.

2. The electrical connector assembly as claimed in claim 1, wherein:
    said extensions of said lateral rod portions of said first pressing rod extend away from each other; and
    a distance between said lateral rod portions of said first pressing rod is substantially smaller than that between said lateral rod portions of said second pressing rod.

3. The electrical connector assembly as claimed in claim 1, wherein said mounting frame of said anchoring device has C-shaped first and second pivot lug units disposed respectively on said first and second sides and engaging pivotally and respectively said intermediate rod portions of said first and second pressing rods.

4. The electrical connector assembly as claimed in claim 1, wherein said mounting frame of said anchoring device has a pair of C-shaped engaging hooks disposed on said first side and engaging releasably and respectively said operating ends of said lateral rod portions of said second pressing rod.

5. The electrical connector assembly as claimed in claim 1, wherein said operating ends of said lateral rod portions of said second pressing rod are hook-shaped.

6. The electrical connector assembly as claimed in claim 1, wherein said bent central sections of said intermediate rod portions of said first and second pressing rods are configured as U-shaped plates.

* * * * *